US010418490B2

(12) United States Patent
Xie

(10) Patent No.: US 10,418,490 B2
(45) Date of Patent: Sep. 17, 2019

(54) FIELD EFFECT TRANSISTOR AND MANUFACTURING METHOD THEREOF

(71) Applicant: Shenzhen China Star Optoelectronics Semiconductor Display Technology Co., Ltd., Shenzhen, Guangdong (CN)

(72) Inventor: Huafei Xie, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 39 days.

(21) Appl. No.: 15/557,456

(22) PCT Filed: Aug. 21, 2017

(86) PCT No.: PCT/CN2017/098256
§ 371 (c)(1),
(2) Date: Sep. 11, 2017

(87) PCT Pub. No.: WO2019/006832
PCT Pub. Date: Jan. 10, 2019

(65) Prior Publication Data
US 2019/0013408 A1  Jan. 10, 2019

(30) Foreign Application Priority Data

Jul. 4, 2017   (CN) .......................... 2017 1 0536785

(51) Int. Cl.
*H01L 21/02* (2006.01)
*H01L 21/28* (2006.01)
(Continued)

(52) U.S. Cl.
CPC .... *H01L 29/78648* (2013.01); *H01L 21/0259* (2013.01); *H01L 21/02521* (2013.01);
(Continued)

(58) Field of Classification Search
CPC ................................................. H01L 21/02628
See application file for complete search history.

(56) References Cited

U.S. PATENT DOCUMENTS

| 2016/0190244 A1* | 6/2016 | Lee ..................... H01L 29/778 257/29 |
| 2017/0261465 A1* | 9/2017 | Balijepalli, IV ... G01N 27/4148 |
| 2018/0012962 A1* | 1/2018 | Yeh ..................... H01L 27/0886 |

FOREIGN PATENT DOCUMENTS

| CN | 102394242 A | 3/2012 |
| CN | 103787325 A | 5/2014 |

(Continued)

OTHER PUBLICATIONS

SK Jin, PJ Jeon, J Lee, K Choi, HS Lee Dual gate black phosphorus field effect transistors on glass for NOR logic and organic light emitting diode switching «Nano Letters», 2015, 15 (9), pp. 5778-5779, Institute of Physics and Applied Physics, Yonsei University, 50 Yonsei-ro, Secdaemun-gu, Seoul 120-749, Korea.

(Continued)

*Primary Examiner* — Moazzam Hossain
*Assistant Examiner* — Omar F Mojaddedi
(74) *Attorney, Agent, or Firm* — Andrew C. Cheng

(57) ABSTRACT

Provided are a field effect transistor and a manufacturing method thereof. With this method, an active layer in the field effect transistor is manufactured by a solution method with black phosphorus nanosheets or black phosphorus quantum dots as material. The manufacturing process is simple to reduce the production cost and enriches the preparation materials of field effect transistor for reducing environmental pollution and dependence on metal elements. Meanwhile, the use of a carbon material, such as graphene or carbon nanotube for the preparation of a source pattern layer, a drain pattern layer and a top gate pattern layer can form an (Continued)

effective ohmic contact with a black phosphorus active layer to reduce the contact resistance.

5 Claims, 5 Drawing Sheets

(51) Int. Cl.
    *H01L 29/10* (2006.01)
    *H01L 29/06* (2006.01)
    *H01L 29/786* (2006.01)
    *H01L 29/24* (2006.01)
    *H01L 29/66* (2006.01)
    *H01L 29/45* (2006.01)
    *H01L 29/778* (2006.01)

(52) U.S. Cl.
    CPC .. *H01L 21/02601* (2013.01); *H01L 21/02628* (2013.01); *H01L 29/0665* (2013.01); *H01L 29/24* (2013.01); *H01L 29/45* (2013.01); *H01L 29/66969* (2013.01); *H01L 29/778* (2013.01)

(56) References Cited

FOREIGN PATENT DOCUMENTS

| | | |
|---|---|---|
| CN | 105428416 A | 3/2016 |
| KR | 20160145903 A | 12/2016 |

OTHER PUBLICATIONS

Jack R.Brent, Nicky Savjani, Edward A. Lewis, Sarah J.Haigh, David J. Lewis and Paul O'Brien Production of few-layer phosphorene by liquid exfoliation of black phosphorus «Chem. Commun» ,5020140809, p. 13339.

* cited by examiner

FIELD EFFECT TRANSISTOR AND MANUFACTURING METHOD THEREOF

FIELD OF THE INVENTION

The present invention relates to a display field, and more particularly to a field effect transistor and a manufacturing method thereof.

BACKGROUND OF THE INVENTION

The field effect transistor is to use semiconductor surface effect, to control the depletion or accumulation of the semiconductor active layer surface hole and electron with the gate voltage to determine the channel conduction condition and to achieve the switching function. The principle of the field effect transistor is simple. The process is mature and reliable. The field effect transistor is widely used in the manufacture of electronic elements and integrated circuits. The performance of the field effect transistor is determined by many factors, such as skill, process, material and element structure. The channel material and element structure fundamentally determine the mobility and the working efficiency of the field effect transistor.

The two-dimensional nanomaterials such as grapheme and transition metal sulfide have shown the extraordinary application potential with the excellent physical property and the structural property in the fields of the electronics, sensors and optoelectronic elements. The graphene as the most representative two-dimensional material has been extensively studied. It has an ultra high carrier mobility but the lack of the band gap has seriously hindered the application of graphene in semiconductor elements, such as field effect transistors. The disulfide bonds in the transition metal sulfide have a significant band gap and show excellent on off ratio properties in the transistor. However, the structural defects of the disulfide bonds may lead to a reduction in electron mobility, which affects the electrical properties thereof. Thus, the method of introducing a band gap in graphene is used.

The black phosphorus has attracted much attention from the scientific community because of the excellent performance. It has a wave layer structure, which is similar to but different from the graphene sheet structure and has a semiconductor gap that the graphene does not have. More importantly, its semiconductor band gap is a direct band gap. Namely, the electronically conductive energy band is at the same location as the nonconductive energy band top. Accordingly, it is considered as the super material in the two-dimensional materials by the scientific community. Meanwhile, due to quantum confinement effect, the black phosphorus quantum dots possesses have more excellent photoelectric properties than the black phosphorus block materials and can be widely used in the field of photovoltaic application and transistor application.

SUMMARY OF THE INVENTION

An objective of the present invention is to provide a field effect transistor and a manufacturing method thereof to solve the problem of how to manufacture a field effect transistors with black phosphorus nanosheets or black phosphorus quantum dots.

For solving the aforesaid objectives, a technical solution employed by the present invention is: providing a manufacturing method of a field effect transistor, comprising steps of: forming an active layer above a substrate by a solution comprising black phosphorus nanosheets or black phosphorus quantum dots; forming a source pattern layer contacting with the active layer and a drain pattern layer contacting with the active layer; wherein the step of forming the active layer above the substrate by the solution comprising the black phosphorus nanosheets or the black phosphorus quantum dots comprises: forming a black phosphorus film layer above the substrate with the solution comprising the black phosphorus nanosheets or the black phosphorus quantum dots by spin coating; evaporating the black phosphorus film layer in vacuum at a low temperature to form a black phosphorus active layer; wherein the step of forming a source pattern layer contacting with the active layer and a drain pattern layer contacting with the active layer comprises: forming a conductive material layer on a base body and transferring the conductive material layer onto the active layer by a transfer process; patterning the conductive material layer by plasma photolithography to form the source pattern layer and the drain pattern layer.

For solving the aforesaid objectives, another technical solution employed by the present invention is: providing a manufacturing method of a field effect transistor, comprising steps of: forming an active layer above a substrate by a solution comprising black phosphorus nanosheets or black phosphorus quantum dots; forming a source pattern layer contacting with the active layer and a drain pattern layer contacting with the active layer.

For solving the aforesaid objectives, one another technical solution employed by the present invention is: providing a field effect transistor, comprising: an active layer formed above a substrate, wherein active layer comprises black phosphorus nanosheets or black phosphorus quantum dots; a source pattern layer contacting with the active layer and a drain pattern layer contacting with the active layer.

The benefits of the present invention are: different from prior arts, the method of the present invention comprises steps of forming an active layer above a substrate by a solution comprising black phosphorus nanosheets or black phosphorus quantum dots; and forming a source pattern layer contacting with the active layer and a drain pattern layer contacting with the active layer. The active layer in the field effect transistor is manufactured with black phosphorus nanosheets or black phosphorus quantum dots as material to enrich the preparation materials of the field effect transistor for reducing environmental pollution as preparing the active layer with a metal dot film layer in prior art and the dependence on the metal elements at the same time.

DETAILED DESCRIPTION OF PREFERRED EMBODIMENTS

In order to enable persons skilled in the art to better understand the technical solution of the present invention, the field effect transistor and the manufacturing method thereof provided by the present invention are described in detail with reference to the accompanying drawings and specific embodiments as follows.

Figure 1:
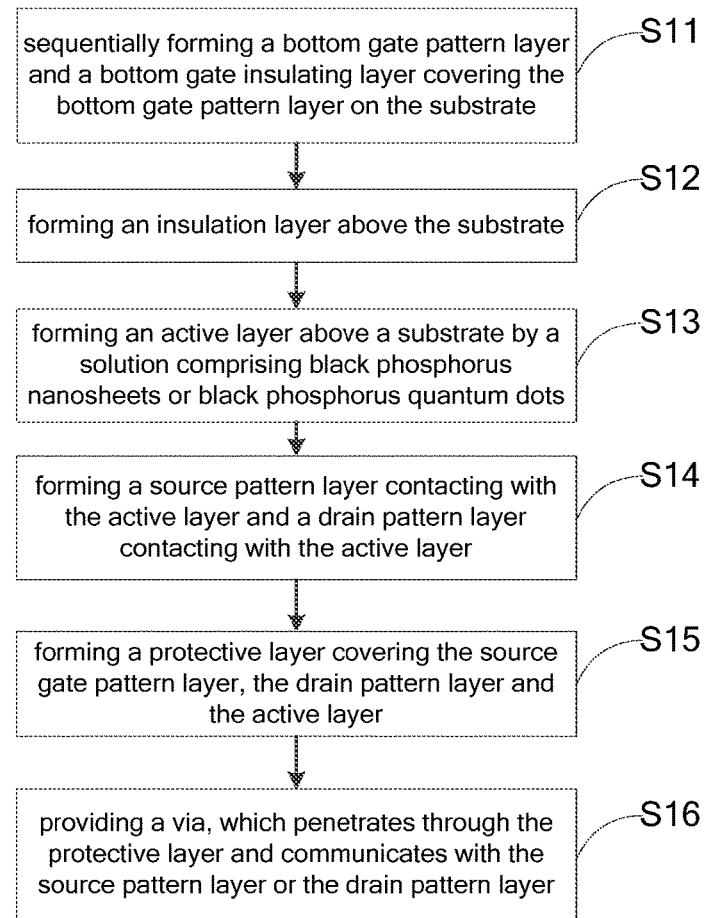
FIG. 1 is a flowchart diagram of the first embodiment according to a manufacturing method of a field effect transistor provided by the present invention.
Figure 2:
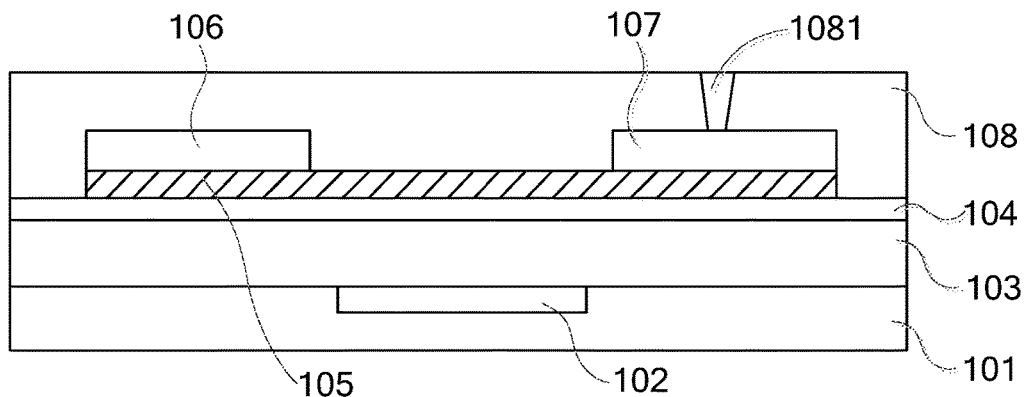
FIG. 2 is a structure diagram of the first embodiment according to a field effect transistor provided by the present invention.

Please refer to FIG. 1 and FIG. 2. The first embodiment according to the manufacturing method of the field effect transistor provided by the present invention comprises:

S11: sequentially forming a bottom gate pattern layer 102 and a bottom gate insulating layer 103 covering the bottom gate pattern layer 102 on the substrate 101; optionally, after the substrate 101 is cleaned, a groove of the bottom gate pattern layer 102 as shown in FIG. 2 is formed on the substrate 101 by a nanoimprint process and then, the conductive material is deposited to form the bottom gate pattern Layer 102.

Alternatively, the conductive material may be formed together with the substrate 101 when the substrate 101 is formed to form a substrate 101 doped with a conductive material, or a conductive material film can be deposited on the substrate 101 by physical vapor deposition and then, the bottom gate pattern layer 102 is formed by a photolithography process of photoresist coating, exposure, development and stripping; furthermore, an insulating material layer of a certain thickness can be deposited on the substrate 101 by physical vapor deposition or plasma vapor deposition to form the bottom gate insulating layer 103.

Optionally, the substrate 101 can be a quartz substrate, a glass substrate, or a silicon substrate but not limited thereto; the conductive material can be a conductive carbon material of graphene or metal type carbon nanotube but not limited thereto; the insulation material can be an insulation material of silica, alumina, silicon nitride or ionic gels but not limited thereto.

Step S12: forming an insulation layer 104 above the substrate 101; optionally, the insulation layer 104 can be an organic insulation layer.

Specifically, the substrate 101 after the aforesaid Step S11 is accomplished is soaked in a solution of acetone, methanol and isopropanol and dried at a certain temperature and then, is placed in an environment with hexamethyldisilazane steam for three minutes to form the organic insulation layer on the bottom gate insulating layer 103. The organic insulation layer has a good waterproof and oxygen barrier effect.

Optionally, a material of the insulation layer 104 can be a material of hexamethyldisilazide or polymethyl methacrylate but not limited thereto.

Step S13: forming an active layer 105 above a substrate 101 by a solution comprising black phosphorus nanosheets or black phosphorus quantum dots; wherein the solution comprising black phosphorus nanosheets or black phosphorus quantum dots can be prepared by methods including liquid stripping method, micromachining stripping, electrochemical methods and laser ablation method but not limited to. For instance, under the anaerobic condition, the bulk black phosphorus is immersed in the organic solvent to form a solution and the inert gas is introduced. The solution is stirred at 2000 rpm for 25 hours and then, is treated by 8000 rpm low speed centrifugation for 10 minutes in a glove box having a water oxygen content less than 5 ppm and finally, the supernatant after centrifugation is collected to obtain the black phosphorus nanosheets solution; moreover, it can also be an option that the black phosphorus block particles of 100 μm in size are dispersed in an organic solvent under the anaerobic condition to form a solution and then, the solution is treated with a probe-type ultrasound for 2 to 4 hours at a power of 1000 W to 1400 W and then is treated with a water bath ultrasound for 8 to 12 hours at a power of 200 W to 400 W and finally, the solution is treated by 8000 rpm centrifugation for 20 min in a glove box having a water oxygen content less than 5 ppm and the supernatant is collected to obtain the black phosphorus quantum dots solution.

Optionally, the organic solvent is N-methylpyrrolidone or anhydrous ethanol.

Figure 3:
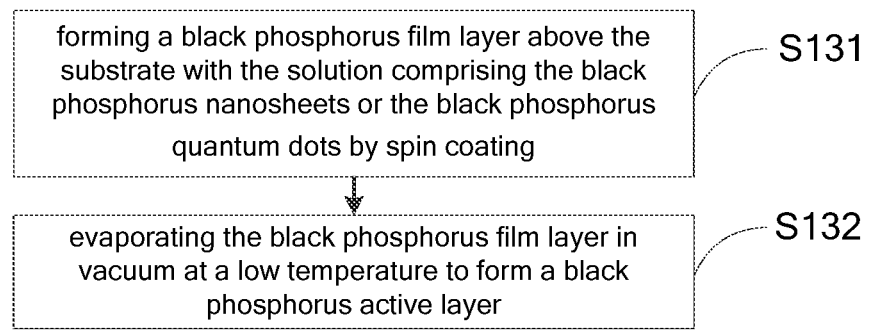
FIG. 3 is a specific flowchart diagram of Step S13 in FIG. 1.

Please refer to FIG. 3, Step S13 specifically comprises:

Step S131: forming a black phosphorus film layer above the substrate 101 with the solution comprising the black phosphorus nanosheets or the black phosphorus quantum dots by spin coating; specifically, the aforesaid solution comprising the black phosphorus nanosheets or the black phosphorus quantum dots may be dropped and added on the insulating layer 104 in a glove box containing a high-purity inert gas and the black phosphorus film of a certain thickness may be formed in a certain period by spin coating.

Optionally, the inert gas is nitrogen, the number of revolutions of the spin coating is 3000 rpm and the spin coating time is 30 seconds.

Step S132: evaporating the black phosphorus film layer in vacuum at a low temperature to form a black phosphorus active layer.

Optionally, the black phosphorus film layer is baked for a certain period in a vacuum atmosphere of 80 Celsius degrees. After the baking is completed, the black phosphorus film layer is patterned to obtain a black phosphorus active layer. In other embodiments, the patterning process of the black phosphorus film in Step S132 can also be performed after the patterning process of the source pattern layer 106 and the drain pattern layer 107 in Step S14.

Figure 4:
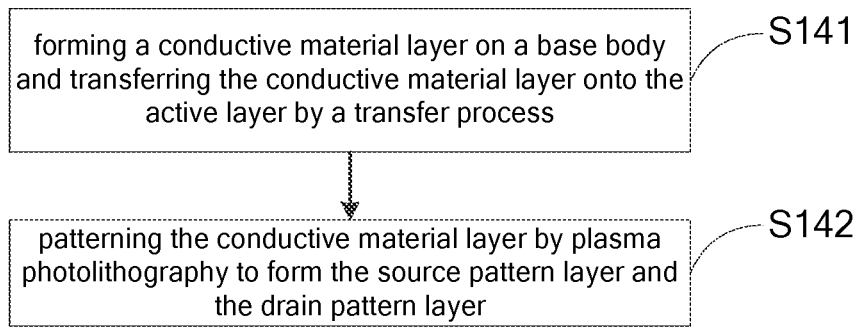
FIG. 4 is a specific flowchart diagram of Step S14 in FIG. 1.

Step S14: forming a source pattern layer 106 contacting with the active layer 105 and a drain pattern layer 107 contacting with the active layer 105; referring to FIG. 4, Step S14 specifically comprises:

Step S141: forming a conductive material layer on a base body and transferring the conductive material layer onto the active layer 105 by a transfer process; optionally, the conductive material layer can be deposited on a copper foil by chemical vapor deposition and then, the conductive material layer can be transferred onto the active layer 105 in Step S13 by a transfer skill.

Step S142: patterning the conductive material layer by plasma photolithography to form the source pattern layer 106 and the drain pattern layer 107; optionally, in other embodiments, after forming the source pattern layer 106 and the drain pattern layer 107, the method further comprises a step of patterning the black phosphide film layer of Step S132 by a reactive ion etching method to form the active layer 105.

Optionally, the conductive material can be a conductive carbon material of graphene or metal type carbon nanotube but not limited thereto.

Step S15: forming a protective layer 108 covering the source gate pattern layer 106, the drain pattern layer 107 and the active layer 105; optionally, a silicon oxide layer covering the source gate pattern layer 106, the drain pattern layer 107 and the active layer 105 may be formed on the insulating layer 104 by chemical vapor deposition as the protective layer 108.

Step S16: providing a via 1081, which penetrates through the protective layer 108 and communicates with the source pattern layer 106 or the drain pattern layer 107.

Specifically, the via 1081 communicating with the source pattern layer 106 or the drain pattern layer 107 is etched in the protective layer 108 by a photolithography process of photoresist coating, exposure, development and stripping. The via communicating with the drain pattern layer 107 is illustrated in the figure of this embodiment.

Figure 5:
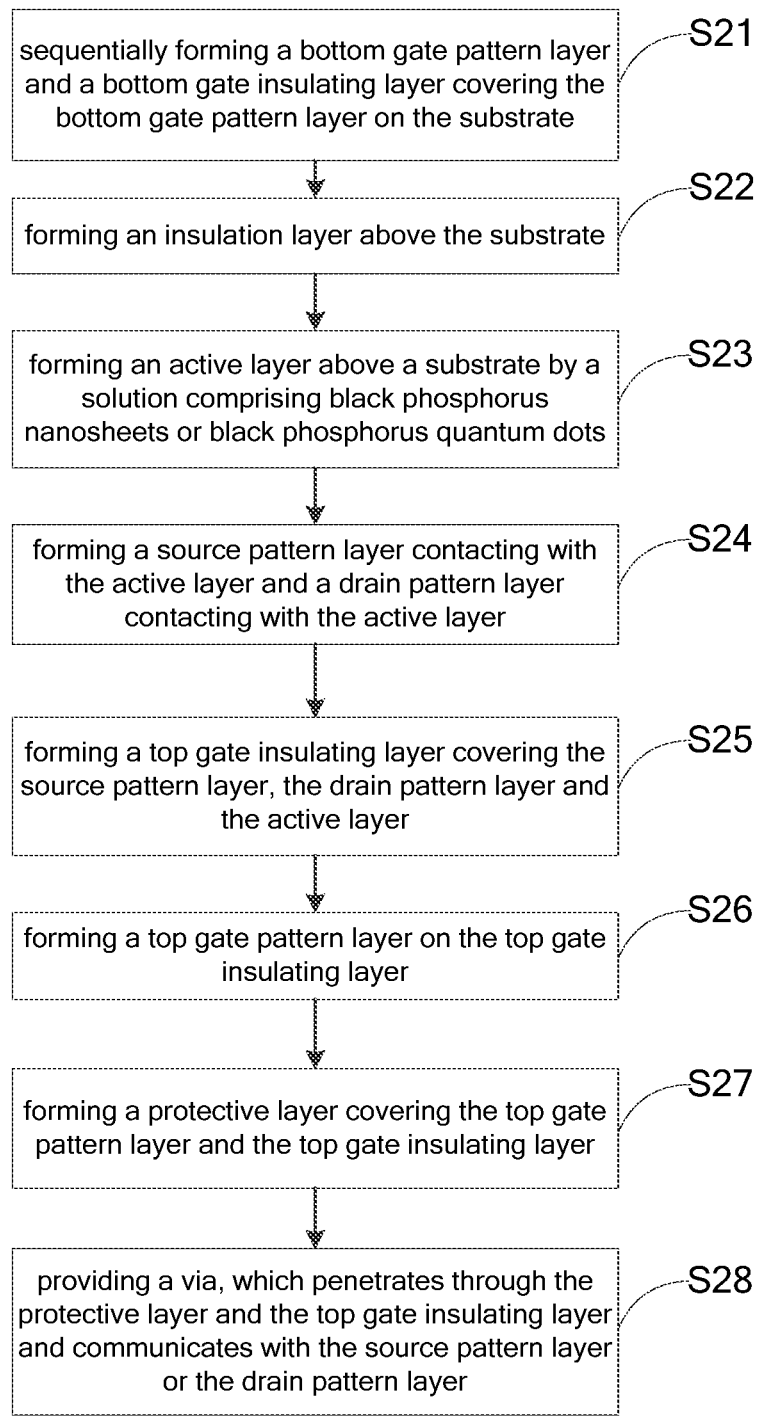
FIG. 5 is a flowchart diagram of the second embodiment according to a manufacturing method of a field effect transistor provided by the present invention.
Figure 6:
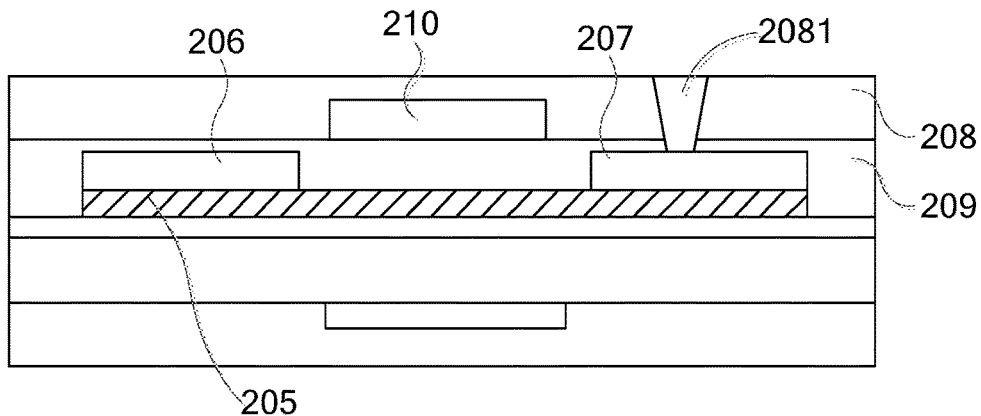
FIG. 6 is a structure diagram of the second embodiment according to a field effect transistor provided by the present invention.

Please refer to FIG. 5 and FIG. 6. Steps S21, S22, S23 and S24 in the second embodiment according to the manufacturing method of the field effect transistor provided by the present invention are the same as Steps S11, S12, S13 and S14 in the foregoing first embodiment and repeated description is omitted here. This embodiment further comprises steps of:

Step S25: forming a top gate insulating layer 209 covering the source pattern layer 206, the drain pattern layer 207 and the active layer 205; specifically, an insulating material layer of a certain thickness can be deposited on the insulating layer 204 by physical vapor deposition or plasma vapor deposition to form the top gate insulating layer 209.

Optionally, the insulation material can be an insulation material of silica, alumina, silicon nitride or ionic gels but not limited thereto.

Step 26: forming a top gate pattern layer 210 on the top gate insulating layer 209; optionally, the conductive material film may be deposited on the top gate insulating layer 209 by spin coating or pulling and then, a patterned conductive material film can be formed by plasma etching after vacuum evaporation at the low temperature to form the top gate pattern layer 210; in other embodiments, the conductive material film may also be deposited on the top gate insulating layer 209 by physical vapor deposition or chemical vapor deposition and then, the top gate pattern layer 210 is formed by a photolithography process of exposure, development, etching and stripping.

Optionally, the conductive material can be a conductive carbon material of graphene or metal type carbon nanotube but not limited thereto.

Step S27: forming a protective layer 208 covering the top gate pattern layer 210 and the top gate insulating layer 209.

Optionally, silicon oxide is deposited on the top gate insulating layer 209 by chemical vapor deposition to form the protective layer 208 covering the top gate pattern layer 210 and the top gate insulating layer 209.

Step S28: providing a via 2081, which penetrates through the protective layer 208 and the top gate insulating layer 209 and communicates with the source pattern layer 206 or the drain pattern layer 207.

Specifically, the via 2081 communicating with the source pattern layer 206 or the drain pattern layer 207 is etched in the protective layer 208 and the top gate insulating layer 209 by a photolithography process of photoresist coating, exposure, development and stripping.

Figure 7:
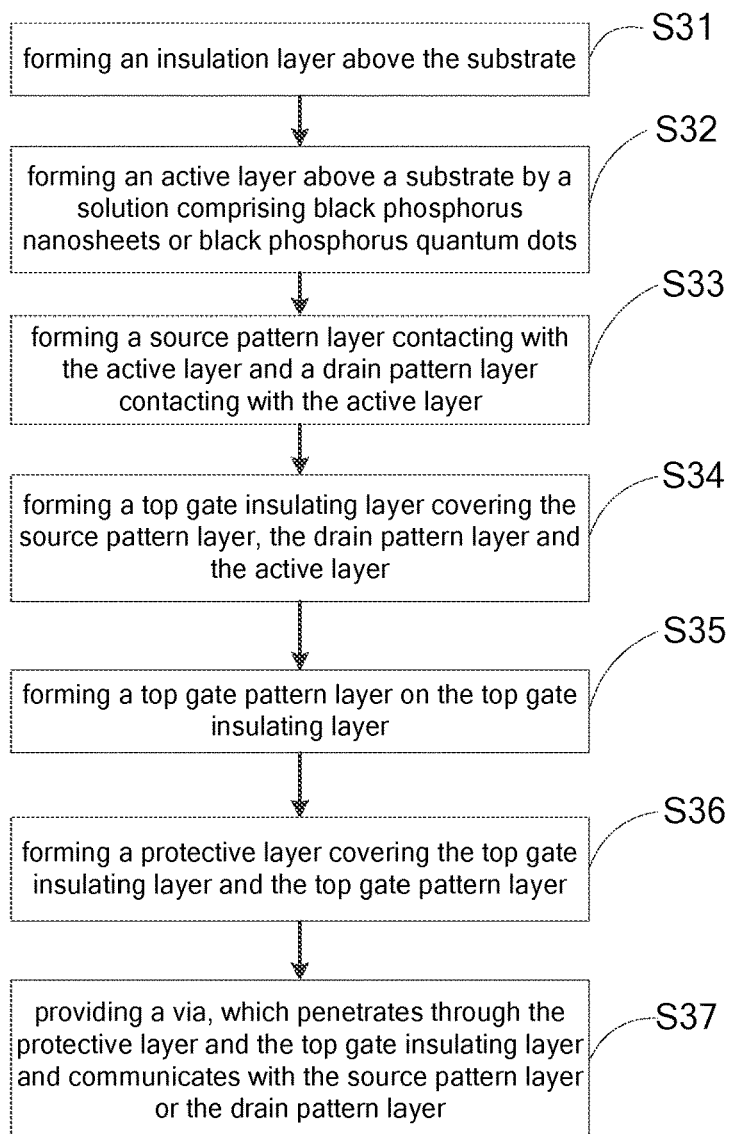
FIG. 7 is a flowchart diagram of the third embodiment according to a manufacturing method of a field effect transistor provided by the present invention.
Figure 8:
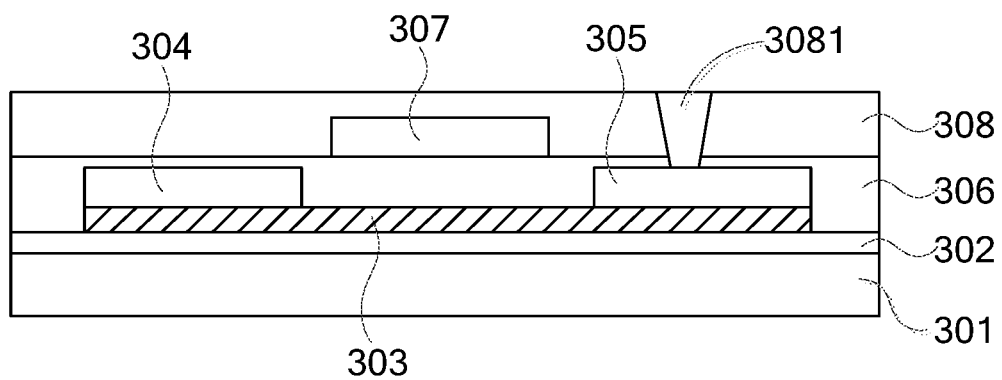
FIG. 8 is a structure diagram of the third embodiment according to a field effect transistor provided by the present invention.

Please refer to FIG. 7 and FIG. 8. The third embodiment according to the manufacturing method of the field effect transistor provided by the present invention comprises:

Step S31: forming an insulation layer 302 above the substrate 301; optionally, the insulation layer 302 can be an organic insulation layer.

Specifically, the substrate 301 is soaked in a solution of acetone, methanol and isopropanol and dried at a certain temperature and then, is placed in an environment with hexamethyldisilazane steam for three minutes to form the organic insulation layer on the substrate 301. The organic insulation layer has a good waterproof and oxygen barrier effect.

Optionally, a material of the insulation layer 302 can be a material of hexamethyldisilazide or polymethyl methacrylate but not limited thereto.

Step S32: forming an active layer 303 above a substrate 301 by a solution comprising black phosphorus nanosheets or black phosphorus quantum dots.

Step S32 is the same as Step S13 in the foregoing first embodiment and the repeated description is omitted here.

Step S33: forming a source pattern layer 304 contacting with the active layer 303 and a drain pattern layer 305 contacting with the active layer 303.

Step S33 is the same as Step S14 in the foregoing first embodiment and the repeated description is omitted here.

Step S34: forming a top gate insulating layer 306 covering the source pattern layer 304, the drain pattern layer 305 and the active layer 303; specifically, an insulating material layer of a certain thickness can be deposited on the insulating layer 302 by physical vapor deposition or plasma vapor deposition to form the top gate insulating layer 306; optionally, the insulation material can be an insulation material of silica, alumina, silicon nitride or ionic gels but not limited thereto.

Step 35: forming a top gate pattern layer 307 on the top gate insulating layer 306; optionally, the conductive material film may be deposited on the top gate insulating layer 306 by spin coating or pulling and then, a patterned conductive material film can be formed by plasma etching after vacuum evaporation at the low temperature to form the top gate pattern layer 307; in other embodiments, the conductive material film may also be deposited on the top gate insulating layer 306 by physical vapor deposition or chemical vapor deposition and then, the top gate pattern layer 307 is formed by a photolithography process of exposure, development, etching and stripping.

Optionally, the conductive material can be a conductive carbon material of graphene or metal type carbon nanotube but not limited thereto.

Step S36: forming a protective layer 308 covering the top gate insulating layer 306 and the top gate pattern layer 307.

Optionally, silicon oxide is deposited on the top gate insulating layer 306 by chemical vapor deposition to form the protective layer 308 covering the top gate pattern layer 307.

Step S37: providing a via 3081, which penetrates through the protective layer 308 and the top gate insulating layer 306 and communicates with the source pattern layer 304 or the drain pattern layer 305.

Specifically, the via 3081 communicating with the source pattern layer 304 or the drain pattern layer 305 is etched in the protective layer 308 and the top gate insulating layer 306 by a photolithography process of photoresist coating, exposure, development and stripping.

Please refer to FIG. 2. The first embodiment according to the field effect transistor provided by the present invention comprises a bottom gate pattern layer 102 and a bottom gate insulating layer 103, an insulating layer 104 formed above the substrate 101, an active layer 105 formed above the substrate 101, a source pattern layer 106 contacting with the active layer 105 and a drain pattern layer 107 contacting with the active layer 105, a protective layer 108 covering the source pattern layer 106, the drain pattern layer 107 and the active layer 105, which are sequentially formed on the substrate 101.

The insulating layer 104 is formed on the bottom gate insulating layer 103; the active layer 105 is formed on the insulating layer 104 and comprises black phosphor nanosheets or black phosphorus quantum dots.

The structure of each layer in this embodiment is prepared by the corresponding steps in the foregoing first embodiment according to the manufacturing method of the field effect transistor and the repeated description is omitted here.

Please refer to FIG. 6. The second embodiment according to the field effect transistor provided by the present invention further comprises a top gate insulating layer 209 and a top gate pattern layer 210. The other structures in this embodiment are the same as those of the foregoing first embodiment of the field effect transistor and the repeated description is omitted here.

The top gate insulating layer 209 covers the source pattern layer 206, the drain pattern layer 207 and the active layer 205. The top gate pattern layer 210 is formed on the bottom gate insulating layer 209.

The structure of each layer in this embodiment is prepared by the corresponding steps in the foregoing second embodiment according to the manufacturing method of the field effect transistor and the repeated description is omitted here.

Please refer to FIG. 8. The third embodiment according to the field effect transistor provided by the present invention comprises an insulation layer 302 and an active layer 303 above the substrate 301, a source pattern layer 304 contacting with the active layer 303 and a drain pattern layer 305 contacting with the active layer 303, a top gate insulating layer 306 covering the source pattern layer 304, the drain pattern layer 305 and the active layer 303, a top gate pattern layer 307 formed on the top gate insulating layer 306 and a protective layer 308 covering the top gate insulating layer 306 and the top gate pattern layer 307.

The structure of each layer in this embodiment is prepared by the corresponding steps in the foregoing third embodiment according to the manufacturing method of the field effect transistor and the repeated description is omitted here.

Different from prior art, the method of the present invention comprises steps of forming an active layer above a substrate by a solution comprising black phosphorus nanosheets or black phosphorus quantum dots; and forming a source pattern layer contacting with the active layer and a drain pattern layer contacting with the active layer. A plurality of field effect transistor structures is provided and the active layer in the field effect transistor is manufactured by a solution method with black phosphorus nanosheets or black phosphorus quantum dots as material. The manufacturing process is simple to reduce the production cost and enriches the preparation materials of field effect transistor for reducing environmental pollution and dependence on metal elements. Meanwhile, the use of a carbon material, such as graphene or carbon nanotube for the preparation of a source pattern layer, a drain pattern layer and a top gate pattern layer can form an effective ohmic contact with a black phosphorus active layer to reduce the contact resistance.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacturing method of a field effect transistor, comprising steps of:
    forming an active layer above a substrate by a solution comprising black phosphorus nanosheets or black phosphorus quantum dots;
    forming a source pattern layer contacting with the active layer and a drain pattern layer contacting with the active layer;
    wherein the step of forming the active layer above the substrate by the solution comprising the black phosphorus nanosheets or the black phosphorus quantum dots comprises:
    forming a black phosphorus film layer above the substrate with the solution comprising the black phosphorus nanosheets or the black phosphorus quantum dots by spin coating;
    evaporating the black phosphorus film layer in vacuum at a low temperature to form a black phosphorus active layer;
    wherein the step of forming a source pattern layer contacting with the active layer and a drain pattern layer contacting with the active layer comprises:
    forming a conductive material layer on a base body and transferring the conductive material layer onto the active layer by a transfer process;
    patterning the conductive material layer by plasma photolithography to form the source pattern layer and the drain pattern layer.

2. The method according to claim 1, wherein the conductive material layer is made of a conductive carbon material of graphene or carbon nanotube.

3. The method according to claim 1, further comprising a step of:
    sequentially forming a bottom gate pattern layer and a bottom gate insulating layer covering the bottom gate pattern layer on the substrate.

4. The method according to claim 3, further comprising steps of:
    forming a top gate insulating layer covering the source pattern layer, the drain pattern layer and the active layer;
    forming a top gate pattern layer on the top gate insulating layer.

5. The method according to claim 1, further comprising a step of:
    forming an insulation layer above the substrate, wherein the active layer is formed on the insulation layer.

* * * * *